United States Patent
Raj et al.

(10) Patent No.: US 11,469,877 B1
(45) Date of Patent: Oct. 11, 2022

(54) HIGH BANDWIDTH CDR

(71) Applicant: XILINX, INC., San Jose, CA (US)

(72) Inventors: Mayank Raj, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/400,762

(22) Filed: Aug. 12, 2021

(51) Int. Cl.
| | |
|---|---|
| H04L 7/033 | (2006.01) |
| H04L 25/03 | (2006.01) |
| H03L 7/099 | (2006.01) |
| H03L 7/089 | (2006.01) |
| H03L 7/08 | (2006.01) |

(52) U.S. Cl.
CPC .......... *H04L 7/0331* (2013.01); *H03L 7/0807* (2013.01); *H03L 7/0891* (2013.01); *H03L 7/099* (2013.01); *H04L 25/03019* (2013.01)

(58) Field of Classification Search
CPC ............. H04L 7/0331; H04L 25/03019; H03L 7/0807; H03L 7/0891; H03L 7/099
See application file for complete search history.

(56) References Cited

U.S. PATENT DOCUMENTS

| | | | |
|---|---|---|---|
| 9,882,703 B1* | 1/2018 | Xu | H04L 25/03885 |
| 10,855,437 B1* | 12/2020 | Chen | H04L 7/0337 |
| 10,868,663 B1 | 12/2020 | Turker Melek et al. | |
| 2004/0202266 A1* | 10/2004 | Gregorius | H03L 7/07 375/376 |
| 2012/0207204 A1* | 8/2012 | Hidaka | H04L 25/03057 375/233 |
| 2019/0109735 A1* | 4/2019 | Norimatsu | H04L 25/03 |
| 2019/0280696 A1* | 9/2019 | Wang | H03L 7/0807 |
| 2019/0332139 A1* | 10/2019 | Rapeta | H03L 7/1976 |
| 2020/0244272 A1* | 7/2020 | Kao | H03L 7/0807 |

* cited by examiner

*Primary Examiner* — Kenneth T Lam
(74) *Attorney, Agent, or Firm* — Patterson + Sheridan, LLP

(57) ABSTRACT

Some examples described herein provide an integrated circuit comprising an auxiliary clock and data recovery (CDR) circuitry. The CDR circuitry is configured to oversample an incoming data signal and generate a locked clock signal. The auxiliary CDR circuitry may comprise a phase-locked loop (PLL) configured to receive the incoming data signal and generate the locked clock signal. The PLL may comprise a phase detector (PD) configured to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

20 Claims, 10 Drawing Sheets

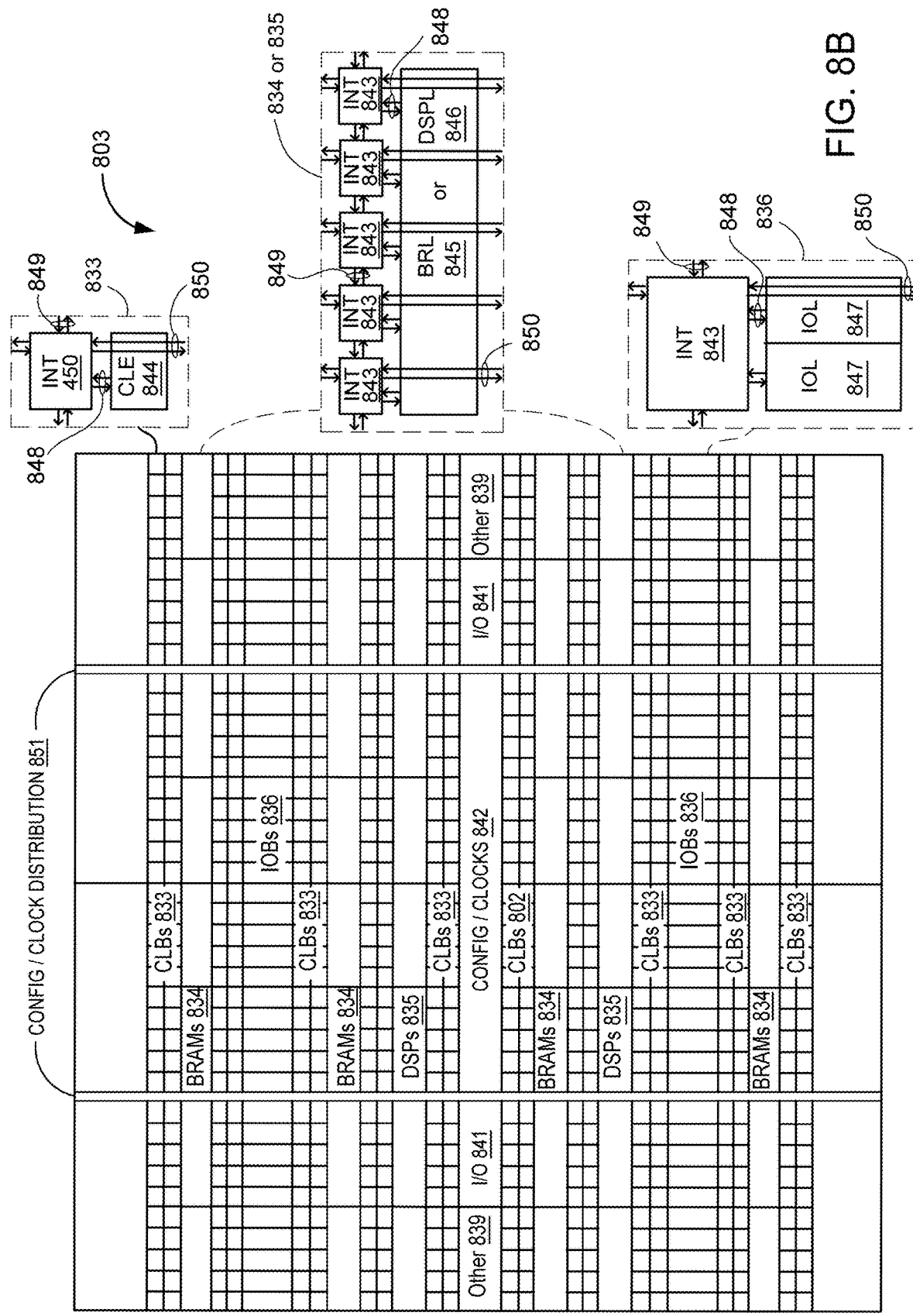

HIGH BANDWIDTH CDR

TECHNICAL FIELD

Various embodiments relate to integrated circuits, and more specifically, to clock and data recovery circuitry.

BACKGROUND

Clock data recovery (CDR) circuitry may generate correct sampling clock phase information for data recovery in high-speed serial communications. A quality of a high-speed serial communication link may be sensitive to the sampling clock phase, especially in the presence of jitter and noise.

In a receiver having a phase interpolator that determines a clock phase for sampling the incoming data, the CDR circuitry may be used to identify whether the currently used clock phase is the best for capturing the incoming data. The CDR circuit may provide dynamic phase adjustments for the phase interpolator and operate to move the clock phase location towards the center of the data eye. The farther the current clock phase is from the center of the data eye, the longer it takes the CDR circuit to lock to the correct clock phase, and longer locking times may lead to data loss.

In some embodiments, the CDR circuitry comprises a digital-based CDR feedback loop circuitry that implement oversamples or baud-rate architectures. Such CDR circuitry can sample incoming data at a receiver and convert the sampled data into digital bits. A phase interpolation circuitry (or similar circuitry) can delay a clock phase based on the digital bits of the sampled data. By repeating these steps in the feedback loop of the CDR circuitry, the CDR circuitry can obtain an optimum clock position.

However, such processing introduces latency, and as an amount of data being received increases, the latency increases. Thus, such CDR circuitry and processing may not be suitable for high bandwidth conditions and conditions in which the data being received has a long pattern with a relatively high count of low-frequency content. Thus, improved systems and methods of high bandwidth CDR circuitry are desirable.

SUMMARY

One embodiment describes an integrated circuit comprising an auxiliary clock and data recovery (CDR) circuitry. The CDR circuitry is configured to oversample an incoming data signal and generate a locked clock signal. The auxiliary CDR circuitry comprises a phase-locked loop (PLL) configured to receive the incoming data signal and generate the locked clock signal. The PLL comprises a phase detector (PD) configured to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

Another embodiment described herein is a method comprising configuring an auxiliary clock and data recovery (CDR) circuitry to oversample an incoming data signal and generate a locked clock signal. Configuring the auxiliary CDR circuitry comprises configuring a phase-locked loop (PLL) to receive the incoming data signal and generate the locked clock signal. Configuring the PLL comprises configuring a phase detector (PD) to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

Another embodiment described herein is an integrated circuit (IC) configured to receive an incoming data signal in response to a reference clock signal. The IC comprises a clock generation circuit configured to receive the reference clock signal and generate a first clock signal. The IC further comprises a phase-locked loop (PLL) configured to receive the incoming data signal and generate a second clock signal; a selection circuit configured to receive the first clock signal and the second clock signal and output a selected dock signal in response to a corresponding selection signal. The PLL comprises a phase detector (PD) configured to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

BRIEF DESCRIPTION OF DRAWINGS

So that the manner in which the features recited above can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 8B illustrates a field programmable gate array (FPGA) implementation of a programmable IC according to an example.

DETAILED DESCRIPTION

Figure 1:
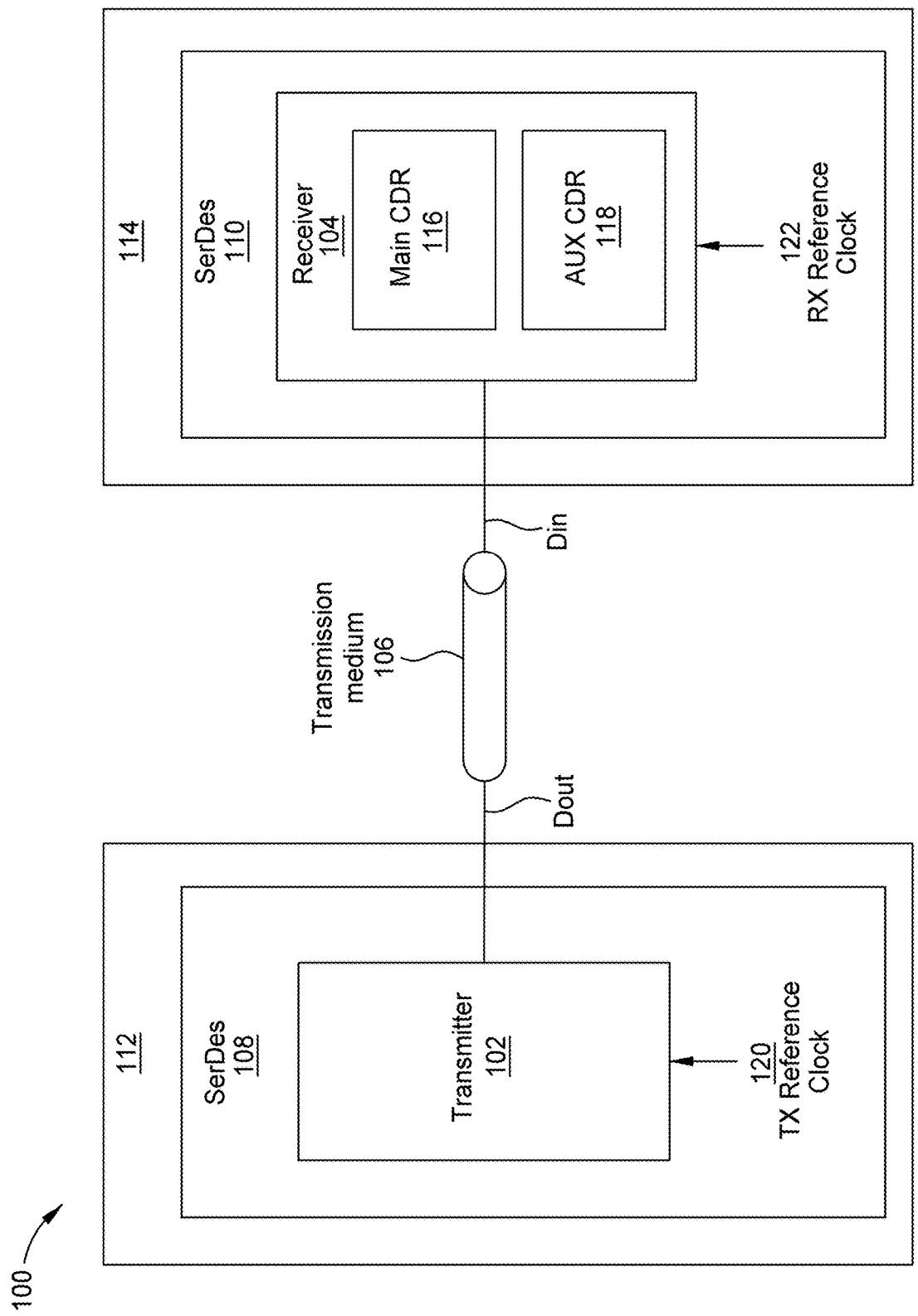
FIG. 1 depicts a communication system comprising a transmitter circuitry and a receiver circuitry, according to an exemplary embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Many communication standards enable large static and dynamic frequency acquisition and tracking requirements. For example, in a Peripheral Component Interconnect Express (PCIe) 6.0 standard, frequency differences between transmitter and receiver can be as high as 3200 parts per million (ppm) in a Separate Reference Clock Independent Spread Spectrum Clocking (SSC) (SRIS) mode. However, as data rates of transceivers increase and enable larger amounts of data processing, alternative signaling methods, such as PAM4 signaling, are utilized, where analog-to-digital conversion (ADC) based receiver architectures are increasingly preferred. Such receiver architectures often exhibit large latency (for example, caused by the conversion of analog signals to digital signals and corresponding processing, such as equalization, of the digital signals), which, therefore, can only support low clock and data recovery (CDR) bandwidth. This low CDR bandwidth may result in smaller frequency (for example, lower ppm) acquisition and tracking capabilities and less filtering for the clock path jitter. Thus, in certain embodiments, the ADC based receiver devices may be unable to meet the ppm requirements of corresponding communication standards.

In some embodiments, systems, methods, and apparatuses described herein implement an analog auxiliary CDR path to provide a low-latency, high bandwidth CDR in a receiving device that supports various signaling methods, such as those that utilize ADC based receiver architectures. The analog auxiliary CDR path enables implementation of larger ppm acquisition and tracking capabilities and support of higher bandwidth and speed communication standards, such as PCIe 6.0, while maintaining improved clock noise filtering and improved jitter performance. Furthermore, the systems, methods and apparatuses employing the analog auxiliary CDR described herein improve handling of inputs received from the transmitting device. For example, the inputs have long patterns (such as pseudorandom binary sequences (PRBSs) of length 31, or PRBS31), and the analog auxiliary CDR described herein meets bit error rates (BERs) associated with the corresponding analog auxiliary CDR with better margins and higher levels of low-frequency content.

FIG. 1 depicts a communication system 100 comprising a transmitter circuitry (transmitter) 102 and a receiver circuitry (receiver) 104, according to an exemplary embodiment.

The transmitter 102 is configured to transmit data $D_{out}$ to the receiver 104 over a transmission medium 106 via a data signal. The receiver 104 receives the data signal as $D_{in}$ over the transmission medium 106. The transmission medium 106 may degrade a quality of the data signal between the transmitter 102 and the receiver 104 before the receiver 104 receives the $D_{in}$. In some embodiments, the received data $D_{in}$ may require reconstruction (or equalization) at the receiver 104 before processing and use. The receiver 104 may advantageously reduce a latency (for example, caused by communication and/or processing of the data), for example, by implementing a fast auxiliary oversampled CDR path that works alongside a slow CDR feedback loop, described in more detail below.

In some embodiments, the transmitter 102 is part of a serializer-deserializer (SerDes) 108. The receiver 104 may also be part of a SerDes 110. In some circumstances, the transmission medium 106 includes one or more of printed circuit board (PCB) traces, vias, cables, connectors, decoupling capacitors, and the like. In some embodiments, the SerDes 108 may be disposed in an integrated circuit (IC) 112, and the SerDes 110 may be disposed in an IC 114.

In certain embodiments, the transmitter 102 drives serial data onto the transmission medium 106 as the $D_{out}$ using, for example, a digital baseband modulation technique. In general, the serial data can be divided into symbols. The transmitter 102 converts each symbol into an analog voltage mapped to the symbol. The transmitter 102 then transmits the analog voltage generated from each symbol via the transmission medium 106. In some embodiments, the transmitter 102 may use a modulation scheme when transmitting the symbols via the transmission medium 106, such as a binary non-return-to-zero (NRZ) modulation scheme. In binary NRZ, a symbol may be one bit of the serial data and two analog voltages may be used to represent each bit. In some examples, the transmitter 102 may use multi-level digital baseband modulation techniques, such as pulse amplitude modulation (PAM), where a symbol includes a plurality of bits of the serial data and more than two analog voltages may be used to represent each bit.

The receiver 104 includes a main clock and data recovery (CDR) circuitry 116. The main CDR circuitry 116 operates to recover data and clock from the analog signal $D_{in}$. The receiver 104 provides the recovered data to, for example, physical coding sublayer (PCS) circuitry (not shown) in SerDes 110 for decoding and further processing. The receiver 104 may also include an auxiliary CDR circuitry 118 such that the receiver 104 may implement much larger parts per million (ppm) acquisition and tacking and support new standards such as PCIe 5.0 and PCIe 6.0 while having improved jitter performance. For example, PCIe 6.0 and future generations of PCIe and similar protocols enable ppm differences between the transmitter 102 and the receiver 104 of, for example, 3200 ppm or more in particular modes, such as a SRIS mode. However, as data rates for transmitters 102 and receivers 104 increase to enable larger amounts of data processing and throughput, alternative signaling methods, such as pulse amplitude modulation 4-level (PAM-4) signaling, are utilized and analog-to-digital converter (ADC) based receiver architectures are increasingly preferred. Corresponding receiver architectures may, however, exhibit large latency and, therefore, may only support low CDR bandwidths. This can result in smaller ppm acquisition and tracking capabilities and less filtering of the clock path jitter by the receiver 104. In some embodiments, an analog auxiliary CDR path that employs, for example, the auxiliary CDR circuitry 118, may provide a high bandwidth CDR in the receiver 104 that supports corresponding or impacted signaling, such as PAM4 and NRZ signaling. The analog auxiliary CDR path enables implementation of larger ppm acquisition and tracking, enabling support for new standards such as PCIe 6.0 and future standards while having better dock noise filtering. Altogether, the use of the analog auxiliary CDR path leads to improved jitter performance.

An exemplary architecture of the receiver 104 is discussed in further detail with reference to FIG. 2.

Continuing to refer to FIG. 1, the transmitter 102 may use a transmitter (TX) reference clock signal 120. Similarly, the receiver 104 may use a receiver (RX) reference clock signal 122. In some embodiments, a frequency offset between the TX reference clock signal 120 and the RX reference clock signal 122 is defined by a difference between the TX reference clock signal 120 and the RX reference clock signal 122. The frequency offset may exist when the TX reference clock signal 120 and the RX reference clock signal 122 use independent clock sources (e.g., clock sources that are nominally but not exactly identical in frequency). In some embodiments, the frequency offset is fixed (e.g., equal to a constant), while in other embodiments, the frequency offset is not be fixed and is, for example, a periodic function of time.

Figure 2:
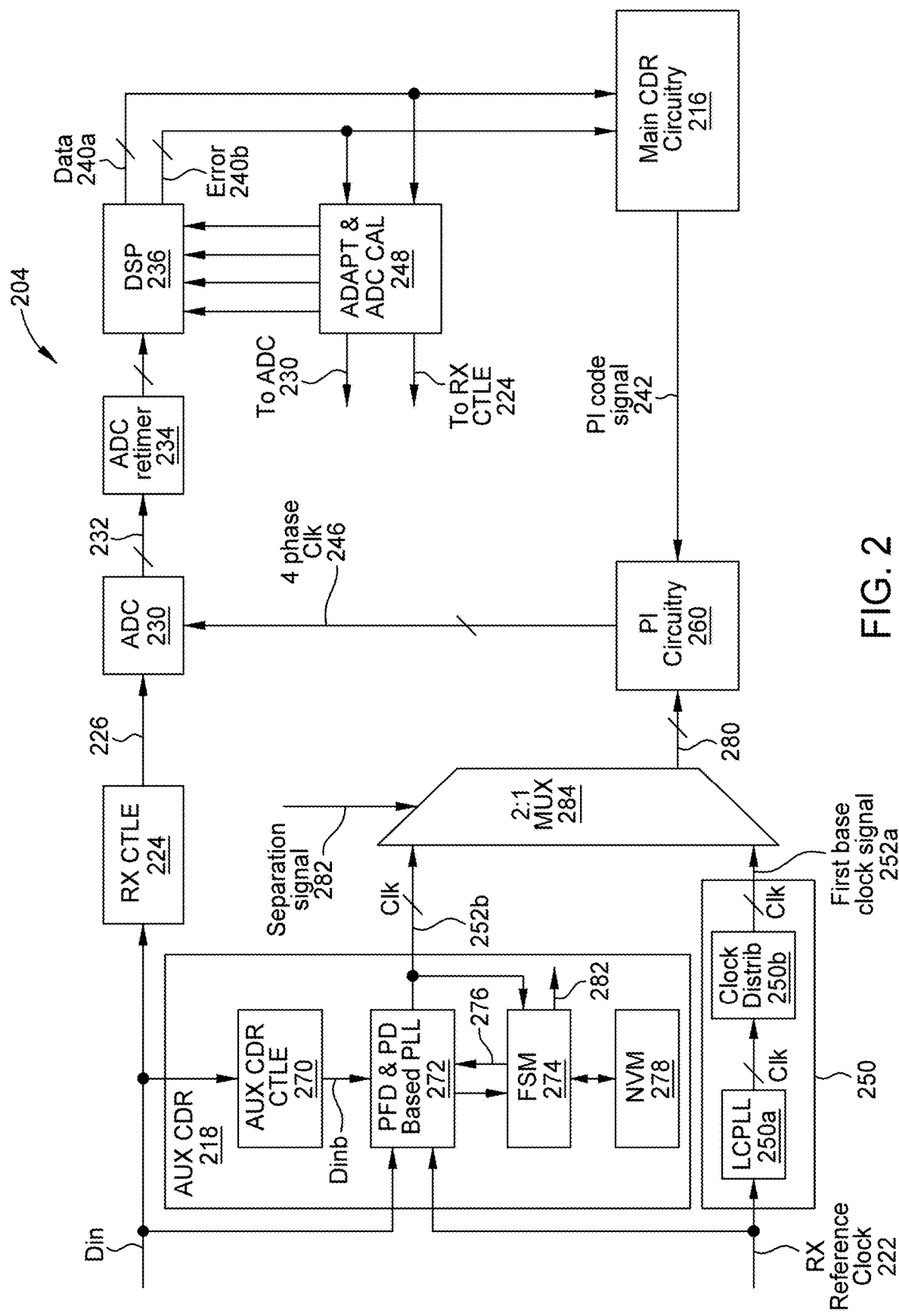
FIG. 2 depicts a block diagram of the receiver circuitry of FIG. 1 having an auxiliary clock and data recovery (CDR) circuitry, according to an exemplary embodiment.

FIG. 2 depicts a block diagram of receiver circuitry (receiver) 204, corresponding to the receiver 104 of FIG. 1, having an auxiliary clock and data recovery (CDR) circuitry 218 corresponding to the auxiliary CDR circuitry 118, according to an exemplary embodiment.

The receiver 204 includes a first continuous time linear equalizer (CTLE) circuitry 224. The first CTLE circuitry 224 receives data received by the receiver 204, such as the analog signal $D_{in}$ received via the transmission medium 106 from the transmitter 102 of FIG. 1. In some embodiments, the first CTLE circuitry 224 performs basic equalization and may operate as a high-pass filter or band-pass filter to compensate for low-pass characteristics of the transmission medium 106.

The first CTLE circuitry 224 generates and outputs a first equalized analog signal 226 corresponding to the filtered and/or compensated analog signal $D_{in}$. The first equalized analog signal 226 is then received by an ADC 230. The ADC 230 may convert the first equalized analog signal 226 into a digital signal 232, for example, in response to a sampling clock signal 246. In some embodiments, the receiver 204 also includes an ADC retimer 234 that receives the digital signal from an output of the ADC 230. The ADC retimer 234 may operate as a clock unification stage (e.g., to sample data safely with single clock of an interleaved ADC).

A digital signal processing (DSP) circuitry 236 (for example, that includes a decision feedback equalizer (DFE) and/or feed forward equalizer (FFE), not shown) is coupled to the output of the ADC 230 or an output of the ADC retimer 234 and receives the digital signal 232 as generated by the ADC 230. In some embodiments, the DSP circuitry 236 is the source for a majority of latency that causes the issues introduced above. In certain embodiments, the ADC retimer 234 is used for clean capture of data by the DSP circuitry 236. The DSP circuitry 236 may equalize the digital signal 232 to compensate for, for example, post-cursor inter-symbol interference (ISI). In some embodiments, the DSP circuitry 236 includes a number of slicers (not explicitly shown) configured to sample the digital signal 232 to generate a data sample 240a and an error sample 240b per symbol k of the digital signal 232.

In some embodiments, the slicers include separate data slicers and edge slicers. For example, the slicers may include four edge slicers. In certain embodiments, each of the slicers samples its input signal using a sampling clock at a baud-rate (or symbol rate) to generate the data and error samples 240a and 240b, respectively. The data samples 240a may comprise clean or deserialized data include estimated values for the symbols, while the error samples 240b may include estimated errors for the symbols. Each data sample 240a and each error sample 240b may include one or more bits depending on the type of modulation scheme employed (for example, one-bit samples for binary NRZ and multi-bit samples for PAM).

A main CDR circuitry 216, corresponding to the main CDR circuitry 116, is coupled to outputs of the DSP circuitry 236 to receive the data samples 240a and error samples 240b. The main CDR circuitry 216 may employ a baud-rate phase detection CDR architecture. The main CDR circuitry 216, thus, generates a phase interpolator (PI) code signal 242 in response to the received data samples 240a and error samples 240b. In some embodiments, the PI code signal 242 generates up/down (early/late) information. The up/down information may comprise digital signals that direct a circuitry (for example, a charge pump) to either increase (up) or decrease (down) a current to a loop filter. In a digital CDR circuitry, the up and down signals may be used to increment (Up) or decrement (down) a digital counter in a finite state machine (FSM), corresponding to information that can be used to identify data eyes and enable alignment of a local clock, such as a RX reference clock signal 222 (corresponding to the RX reference clock signal 122), described in more detail below.

The receiver 204 also includes a clock generation circuitry 250 configured to receive the RX reference clock signal and generate a first base clock signal 252a. The clock generation circuitry 250 receives the RX reference clock signal 222 at its input and generates a first base clock signal 252a at its output. In some embodiments, the clock generation circuitry 250 comprises a first phase-locked loop (PLL) 250a. The first PLL may include a LC-tank based PLL (i.e., an LCPLL) 250a. In some embodiments, the clock generation circuitry 250 also comprises a clock distribution circuitry 250b configured to distribute the first base clock signal 252a to other elements in the receiver 204 (not shown).

In certain embodiments, the receiver 204 also includes a phase interpolator (PI) circuitry 260. The PI circuitry 260 receives the first base clock signal 252a from the clock generation circuitry 250. The PI circuitry 260 may shift (or adjust) the phase of the first base clock signal 252a based on the PI code signal 242 output by the main CDR circuitry 216. This phase shifting of the first base clock signal 252a may align the clock signal with the center of the data eye identified by the main CDR circuitry 216. The PI circuitry 260 may output the phase-shifted clock signal as the sampling clock signal 246 used by the ADC 230, for example, to convert the first equalized analog signal 226 into the digital signal 232. In some embodiments, the PI circuitry 260 may produce fine, evenly spaced sampling phases to allow the main CDR circuitry 216 to have fine phase control. The main CDR circuitry 216 may track the incoming data signal $D_{in}$ that can have a frequency offset from the local RX reference clock signal 222. In some embodiments, the main CDR circuitry 216 comprises a phase detector circuitry (not shown) configured to receive the data samples 240a and the error samples 240b to generate the PI code signal 242. In some embodiments, the PI circuitry 260 may be replaced by, for example, a phase interpolator and an in-phase and quadrature phase generator (not shown).

The data samples 240a and the error samples 240b output by the DSP circuitry 236 are also received by an adaptation and calibration circuitry 248. In some embodiments, the adaptation and calibration circuitry 248 generates control signals 248a for the first CTLE circuitry 224 and control signals 248b for calibration of the ADC 230. In some embodiments, the adaptation and calibration circuitry 248 also generates an adaptation control code to adapt the decision circuitry (for example, the DFE, the FFE, and so forth) in the DSP circuitry 236, using known algorithms. In certain embodiments, the adaptation and calibration circuitry 248 adjusts a peak of frequency response provided by or of the first CTLE circuitry 224.

In some embodiments, the receiver 204 comprises the auxiliary CDR circuitry 218 to implement larger ppm acquisition and tacking, to reduce the large latency of ADC-based receiver architectures, and to support large clock and data recovery (CDR) bandwidth, as introduced above. In some embodiments, the auxiliary CDR circuitry 218 enables the receiver 204 to support new and future communication standards and protocols, such as PCIe 5.0 and PCIe 6.0 while having improved jitter performance.

The auxiliary CDR circuitry 218 includes a second CTLE circuitry 270 configured to receive the analog signal $D_{in}$ received via the transmission medium 106. The second CTLE circuitry 270 may include one or more stages of CTLE (not explicitly shown in this figure), which may be used with a peaking circuitry, such as an inductive t-coil peaking circuitry, to provide a large amount of peaking (for example, around 18 dB of peaking) at, for example, 16 GHz. In some embodiments, the t-coils may be coupled with inductors to provide inductive peaking in the CTLE's response in an area efficient manner. With this peaking, only Nyquist content of the incoming data $D_{in}$ will be boosted, and remaining content will be suppressed. In some embodiments, the second CTLE circuitry 270 is over peaked and need not be strictly linear in the auxiliary CDR circuitry 218 to make the design of the auxiliary CDR circuitry 218 simpler. The second CTLE circuitry 270 outputs a second equalized analog signal $D_{inb}$ at its output.

The auxiliary CDR circuitry 218 also includes a second PLL 272 configured to receive the incoming data $D_{in}$, the second equalized analog signal $D_{inb}$ from the CTLE circuitry 270, and the RX reference clock signal 222. Based, at least in part, on these inputs, the second PLL 272 generates a second base clock signal 252b. The second PLL may include a phase-frequency detector (PFD)-based PLL and/or a phase detector (PD)-based PLL. The second PLL 272 may be configured to work in two different modes: (1) a PFD-based mode, for example, where only the PFD-based PLL is enabled with a clock path; and (2) a PD-based mode, where only the PD-based PLL is enabled with a data path data path. A FSM 274 is coupled to the second PLL 272 and configured to monitor, for example, a state of the second PLL 272. The FSM 274 may send one or more control signals 276 to the second PLL 272 to configure the second PLL 272 to operate in one or more different modes and with one or more different settings, and so forth. In some embodiments, the FSM 274 may be coupled to a data store, such as non-volatile memory NVM 278, to execute programs stored in the data store. For example, the NVM 278 may store instructions that, when executed by the FSM 274, cause the FSM 274 to perform operations to generate control signals and selection signals. The architecture of the second PLL 272 will be discussed in further detail with reference to FIG. 3.

The receiver 204 also includes a selection circuitry 284 (implemented as a multiplexer) configured to receive the first base clock signal 252a from the clock generation circuitry 250 and the second base clock signal 252b from the second PLL 272 and select which clock to utilize in the PI circuitry 260. In this depicted example, the selection circuitry 284 is a two-input multiplexer. The selection circuitry 284 outputs a selected clock signal 280 in response to a selection signal 282. The selection signal 282 may be generated by the FSM 274. The auxiliary CDR path through the auxiliary CDR circuitry 218 may be provided by applying the second base clock signal 252b to the PI circuitry 260.

The auxiliary CDR path may provide a high bandwidth CDR in the receiver 204 that supports, for example, both PAM4 and NRZ signaling (or other signaling) such that the receiver 204 supports larger ppm acquisition and tracking.

In some embodiments, the receiver 204 may also include an automatic gain control (AGC) circuitry (not shown). The output of the first CTLE circuitry 224 may be coupled to an input of the AGC circuitry, and the AGC circuitry may be used to control a gain of the high-pass filter of the first CTLE circuitry 224. The gain of the AGC circuitry may be controlled by the adaptation and calibration circuitry 248. In some embodiments, the AGC circuitry precedes the first CTLE circuitry 224. In other embodiments, the receiver 204 includes other types of continuous-time filters with or without amplification. In some embodiments, different algorithms are used to make the first CTLE circuitry 224 only look at the first post-cursor. In some embodiments, the receiver 204 also includes a deserializer (not shown) to group data samples 240a and error samples 240b to generate a deserialized signal for processing by the main CDR circuitry 216.

In operation of the receiver 204, when the auxiliary CDR circuitry 218 is disabled (e.g., the selected clock signal 280 is the first base clock signal 252a), in a regular CDR mode, the LCPLL 250a generates the correct clock frequency based on a reference frequency $F_{ref}$ of the RX reference clock signal 222, and the LCPLL 250a may divide ratio N and output the first base clock signal 252a having a frequency of $N*F_{ref}$. The ratio N may comprise a feedback divider ratio in a PLL that provides more flexibility in the reference clock frequency for a fixed LCPLL, such as the LCPLL 250a. In some embodiments, where the reference frequency is fixed at 100 MHz, an N ratio of 80 may provide an 8 GHz frequency from the LCPLL. For example, when a 112 Gbps PAM4 operation is used, the Nyquist frequency of the data signal would be, for example, 28 GHz. Quadrature phases of a clock signal having a frequency of, for example, 14 GHz may be used to reduce clock distribution power. The clock signal having the frequency of 14 GHz may be then sent to the PI circuitry 260, which takes the PI code signal 242 generated by the main CDR circuitry 216 and rotates the clock phase of the sampling clock signal 246 at the ADC 230. Thus, the incoming data $D_{in}$ is sampled by the ADC 230 and processed by the DSP circuitry 236 based on a CDR algorithm, and the PI code signal 242 may be generated. This may continue until the main CDR circuitry 216 locks to an optimum point to minimize a bit error rate (BER).

When the auxiliary CDR circuitry 218 is enabled (e.g., the selected clock signal 280 is the second base clock signal 252b), the LCPLL 250a is disabled and the selection circuitry 284 chooses the auxiliary CDR path. The auxiliary CDR circuitry 218 gets the data input $D_{in}$ and pads and passes the data input $D_{in}$ through the second CTLE circuitry 270, which generates the output $D_{inb}$, as described above. The output $D_{inb}$ from the second CTLE circuitry 270 is then sent to the second PLL 272. An example operation of the second PLL 272 will be described in further detail with reference to FIG. 3.

Figure 3:
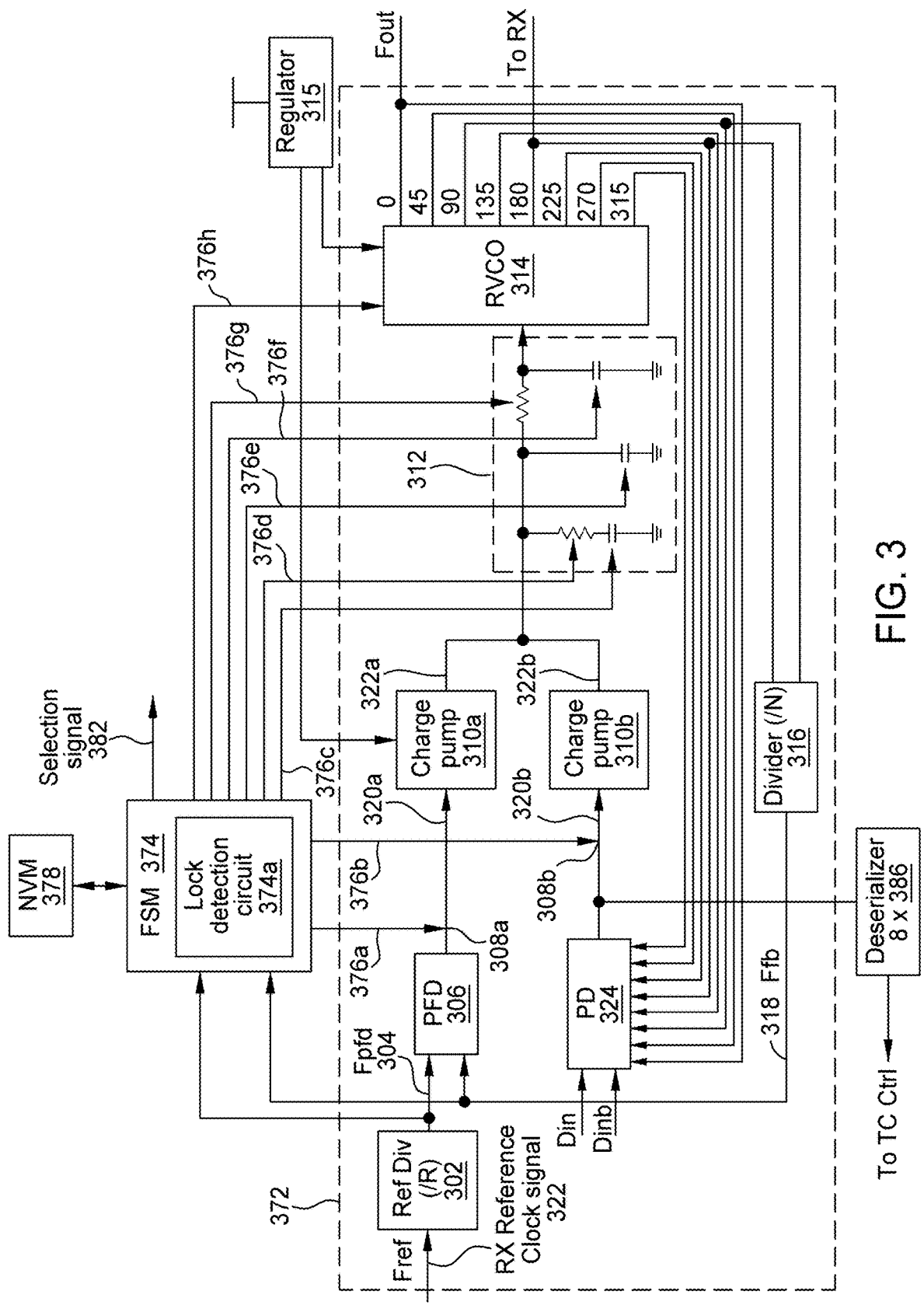
FIG. 3 depicts a block diagram of a phase-locked loop (PLL) implemented in the auxiliary CDR circuitry of FIG. 2.

FIG. 3 depicts a block diagram of a second phase-locked loop (PLL) 372, corresponding to the second PLL 272 implemented in the auxiliary CDR circuitry 218 of FIG. 2. The second PLL 372 may include two modes: a clock mode and a data mode. The clock mode may correspond to a PFD-based mode and the data mode may correspond to a PD-based mode. As discussed with reference to FIG. 2, the second PLL 372 includes a phase-frequency detector (PFD)-based PLL and a phase detector (PD)-based PLL. The second PLL 372 may be configured to work in two different modes: the PFD-based mode where only the PFD path is enabled and the PD-based mode where only the PD path is enabled.

The PFD-based PLL includes a reference divider 302 configured to receive the RX reference clock signal 322 (corresponding to the RX reference clock signal 122 of FIG. 1) having a frequency of $F_{ref}$. The reference divider 302 generates a first divided clock signal 304 having a frequency of $F_{pfd}$. The PFD-based PLL further includes a PFD 306, a first charge pump system 310a, a loop filter (LF) 312, an oscillator 314, such as a voltage-controlled oscillator (VCO) 314, and an N-fold digital divider 316, where N may be any positive integer. In some embodiments, the VCO 314 may be a ring-VCO (RVCO) that is an LCVCO. The N-fold digital divider 316 may generate a second divided clock signal 318 having a frequency of $F_{fd}$. The PFD-based PLL may be enabled or disabled by controlling a switch 308a arranged between an output of the PFD 306 and the first charge pump system 310a. In some embodiments, the first charge pump system 310a may include a number of (for example, 8, 10, 14, and so forth) charge pump circuitries. Each charge pump circuitry may provide a current between, for example, 5 uA-1 mA.

The PFD 306, when enabled by the switch 308a with, for example, a control signal 376a, may compare positive-going edges of the first divided clock signal 304 to the second divided clock signal 318 and generate a comparison signal 320a. The control signal 376a, corresponding to one of the control signals 276 generated by the FSM 274, may be generated by the FSM 374. The comparison signal 320a is then output to the first charge pump system 310a, which transforms the comparison signal 320a into a control voltage signal 322a. A value of the control voltage signal 322a at a given instant in time may depend on the inputs received from the PFD 306 (i.e., the comparison signal 320a). The control voltage signal 322a may drive the LF 312 with current pulses having widths proportional to a phase difference between the two clock signals received by the PFD 306. The current pulses are low-pass filtered by the LF 312, and the resulting waveform may drive the RVCO 314. A regulator 315 may be configured to provide power supply for the first charge pump system 310a and the RVCO 314.

The LF 312 includes a first leg comprising a first resistor R1 connected in series with a first capacitor C1 to ground, a second leg connected in parallel to the first leg and comprising a second capacitor C2 to ground, a second resistor R2, and a third leg comprising a third capacitor C3 to ground. The RVCO 314 may operate, for example, between 4 and 8 GHz and generate eight clock signals having the same frequency $F_{out}$ and different phases, where $F_{out}=N*F_{pfd}$. The phase difference between two adjacent clock signals of the eight clock signals may be, for example, 45 degrees. The clock signal 304 having the frequency $F_{pfd}$ and the second divided clock signal 318 having the frequency $F_{fd}$ are received by the FSM 274. In some embodiments, to achieve oversampling at 16 GHz Nyquist frequency (for example, for 64 Gbps PAM4 data), the RVCO 314 may generate 8 phases with 8 GHz clock. These 8 phases may pass to 12 flip-flops that capture 12 samples of incoming data. 8 slicers may operate as data slicers at 0°, 90°, 180°, and 270° of the clock. 2 slicers may be used for each of these phases of the clock, on each for a data high threshold (Dh) and a data low threshold (Dl). Additionally, 4 edge slicers exist at each of 45°. 135°, 225°, and 315° of the clock. The edge slicers may use a threshold of $V_{cm}$. Samples captured at or based on the thresholds by the 12 slicers may be compared to determine up/down information. Intersymbol interference (ISI) filter components of the PD 324 limit use of threshold according to rising and falling transitions that originate and end in the region greater than Dh and/or less than DI. For example, for phase 0, the ISI filter components may use rising transitions such that $Dh_0=1$ and $Dl_{90}=0$ or falling transitions such that $Dh_0=1$ and $Dl_{90}$. This allows for primary transitions that are relatively clean of ISI and have high signal to noise ratio. Further details are provided with regard to FIG. 5 below. In some embodiments, though not explicitly shown, the LF 312 comprises or corresponds to a digital loop filter and the oscillator 314 comprises or corresponds to a digitally controlled oscillator.

The PD-based PLL includes a phase detector (PD) 324 configured to receive the incoming data $D_{in}$ and the second equalized analog signal $D_{in}$ and, in response to, for example, the eight clock signals with eight phases generated by the RVCO 314, captures samples of the incoming data $D_{in}$. The PD 324 may comprise the eight data slicers and the four edge slicers introduced above. These samples then may be compared to determine up/down information (phase difference) 320b. The up/down information 320b may be then used to control a second charge pump system 310b to either increase or decrease an output phase of the RVCO 314 until both frequency lock and phase lock are achieved for the incoming data $D_{in}$. In some embodiments, the second charge pump system 310b may include a number of charge pump circuitries (for example, 8, 10, 12, and so forth). Each charge pump circuitry may provide, for example, a current between 5 uA and 0.3 mA.

In certain embodiments, the PD 324 generates a plurality of outputs, such as 12 total outputs comprising 8 data samplers or slicers and 4 edge samplers or slicers. These outputs, along with being passed to the second charge pump system 310b, are also passed to a deserializer circuitry 386. The deserializer circuitry 386 may divide outputs received from the PD 324 by a factor, for example, of 8 and provide lower speed outputs to a digital processor. As described in more detail below, the digital processor may perform loop calibration of one or more components and/or settings of the receiver 204. In some embodiments, where the output from the PD 324 comprises 12 outputs and the deserializer circuitry 386 deserializes the 12 outputs by 8, the deserializer circuitry generates an output of 96 bits for processing by the digital processor. Further details regarding the deserializer circuitry 386 are provided below.

The PD-based PLL may be enabled or disabled by controlling a switch 308b arranged between the PD 324 and the second charge pump system 310b with, for example, a control signal 376b generated by the FSM 374. The second charge pump system 310b may transform the up/down information 320b generated by the PD 324 into a control voltage signal 322b having a value at a given instant in time that depends on the inputs received from the PD 324. In some embodiments, the PD 324 includes ISI filtering. In some embodiments, the PD 324 with ISI filtering implements a filter that limits identification of data transitions to use for shifting the phase of the RX reference clock signal 322, and so forth. The PFD-based PLL and the PD-based PLL share the LF 312 and the RVCO 314 to reduce an area of the second PLL 372. The capacitance values of the first capacitor C1, the second capacitor C2, and the third capacitor C3 and the resistance values of the resistor R1 and the resister R2 may be programmed in response to one or more control signals, such as control signals 376c-376g generated by the FSM 374. For example, when the second PLL 372 is configured to work in the PFD-based mode, a first set of values may be applied to the resistances and the capacitances in the LF 312. When the second PLL 372 is configured to work in the PD-based mode, a second set of values may be applied to the resistances and the capacitances in the LF 312.

The exemplary operations of the receiver 204 in conjunction with the second PLL 372 and the FSM 374 are now further explained. At the beginning of the receiver 204 operation, the auxiliary CDR circuitry 218 may need to acquire frequency lock. The PFD-based PLL uses the RX reference clock signal 322 (for example, having the reference frequency, $F_{ref}$). Because a free-running frequency (for example, between the 4 and 8 GHz described above) of the RVCO 314 may be different from a desired output frequency, the FSM 374 may be configured to perform frequency hunting and bring the RVCO 314 into a vicinity of a target operation frequency (for example, $N*F_{ref}$).

The FSM 374 may perform operations stored in, for example, the NVM 378 (corresponding to the NVM 278) to generate the control signal 376a to enable the PFD path via the first switch 308a, the PFD path comprising the reference divider 302, the PFD 306, the charge pump system 310a, and the feedback divider 316. The FSM 374 may generate the control signal 376b to disable the PD path via the second switch 308b. The FSM 374 may also generate control signals 376c-376g to set the capacitances and resistances of the elements in the LF 312 and generate the selection signal 382 to output, for example, the first base clock signal. The PFD-based PLL may then go into the phase lock mode and lock the phase to the incoming RX reference clock signal 322 as well. Once lock is achieved, a lock detection circuitry 374a of the FSM 374 may generate a signal (not shown) indicating that the PFD-based PLL is both frequency and phase locked to the RX reference clock signal 322.

The RX reference clock signal 322 will have a ppm frequency difference from the incoming data $D_{in}$ due to, for example, differences between the RX reference clock signal 322 and the TX reference clock signal. Thus, locking to the reference frequency, $F_{ref}$, while close to the correct data frequency, may not be sufficient to achieve a true frequency and phase lock to the incoming data $D_{in}$. Thus, once the lock detection circuitry 374a generates the signal indicating that the PFD-based PLL is both frequency and phase locked, the FSM 374 may then generate control signals 376a-376g to disable the PFD path, enable the PD path (comprising the PD 324 and the second charge pump system 310b), set the capacitances and resistances of the elements in the LF 312, and generate the selection signal 282 to output the second base clock signal. As an oversampled auxiliary CDR architecture is implemented, the up/down information 320b of the incoming data Din can be generated. By using the oversampled architecture, a strict linearity requirement from the front end may be advantageously reduced or eliminated, and large peaking stages at the second CTLE circuitry 270 (not shown in this figure) may be used without needing strict adaptation schemes to limit over peaking.

When the FSM 374 disables the PFD path and uses the PD path, the large gain of the PD 324 may lead to a very wide bandwidth. To ensure stability of the second PLL 372, the resistances and capacitances in the LF 312 may updated accordingly in response to the control signals 376 generated by the FSM 374. For example, when the second PLL 372 is working in the PFD-based mode, the resistors and capacitors may have or be set to a first set of resistance and capacitance values and a second set of resistance and capacitance values when the second PLL 372 is operating in the PD-based mode. In some embodiments, the first and second sets of resistance and capacitance values include the same, overlapping, or different values for corresponding components and are applicable in different clock or data modes.

The wide bandwidth of the second PLL 372 may advantageously lead to a large acquisition range. Therefore, even if the ppm difference between the incoming data $D_{in}$ and the frequency (e.g., $N*F_{ref}$) of the PLL in PFD mode is large, once the PD-based mode is enabled, the auxiliary CDR circuitry 218 may also acquire the correct frequency and lock. The auxiliary CDR circuitry 218 may also track large spread spectrum clocking parts per million (SSC ppm) patterns.

In some embodiments, the main CDR path (from the ADC 230 to the PI circuitry 260) does not need to be disabled and may work together with the auxiliary CDR path. The auxiliary CDR path may create the clock signal that is locked to and tracking the incoming data $D_{in}$, and the main CDR path may generate a corresponding PI code to offset the clock phase, if needed. Thus, the main CDR path may still slowly compensate for mismatches and offsets though the use of the PI circuitry 260, and the ppm tracking and acquisition may be handled by the fast auxiliary CDR path. Thus, large ppm differences may be acquired and tracked, and clock jitter filtering may be improved (for example, reduced) due to a large CDR corner frequency.

In some embodiments, by implementing the auxiliary CDR circuitry 218, the receiver may support many different data rates and standards, from, for example, 32 Gpbs NRZ up to 112 Gbps PAM4, and the second PLL 372 may have a continuous 2× frequency range from, for example, 7 GHz to 14 GHz. Furthermore, the receiver comprising the auxiliary CDR circuitry 218 may support PCIe standards (such as the PCIe generation 1-6 standards) that use frequencies from 5 GHz to 8 GHz. However, such a receiver is not limited to the identified standards or frequencies.

Figure 4:
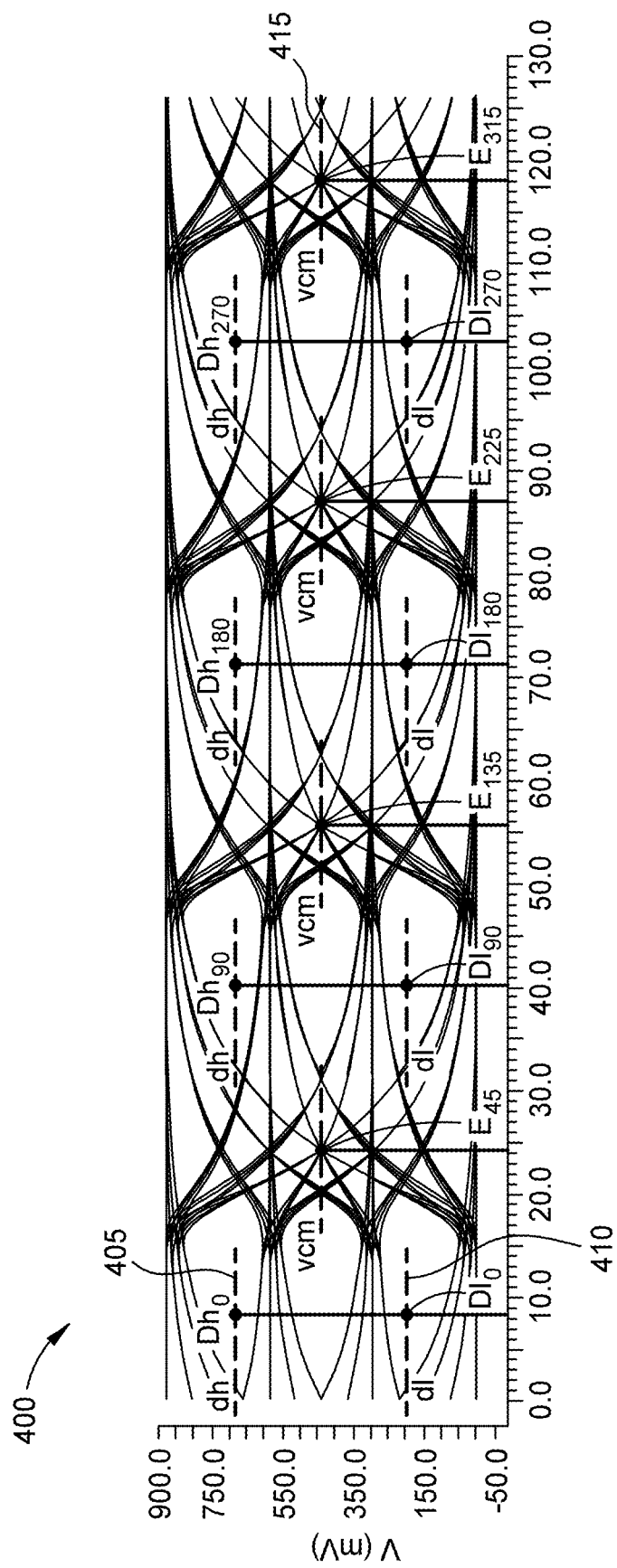
FIG. 4 depicts a graph of voltage and timing thresholds and logic used by edge slicers to capture samples, according to an exemplary embodiment.

FIG. 4 depicts a representative eye and thresholds diagram 400 of power levels (measured in voltage) in a modulation scheme with respect to time, according to an exemplary embodiment. The diagram 400 depicts a power in millivolts (mV) along the y-axis as a function of time along the x-axis. Specifically, the diagram 400 depicts four PAM-4 eyes due to a quarter rate fashion. In some embodiments, the PD, for example the PD 324 of FIG. 3, is decoupled from equalization of the CTLE, such as the CTLE 270 of FIG. 2. The CTLE may reduce edge ISI and the PD then optimizes its Dh and Dl levels according to the shape of the eye received from the CTLE The diagram 400 shows when and where the 12 slicers introduced above (for example, the 8 data slicers and the 4 edge slicers) sample the data signal: the data low slicer at 0° ($Dl_0$), the data high slicer at 0° ($Dh_0$), the edge slicer at 45° ($E_{45}$), the data low slicer at 90° ($Dl_0$), the data high slicer at 90° ($Dh_{90}$), an edge slicer at 135° ($E_{136}$), the data low slicer at 180° ($Dh_{180}$), the data high slicer at 180° ($Dh_{180}$), the edge slicer at 235° ($E_{235}$), the data low slicer at 270° ($D_{120}$), the data high slicer at 270° ($Dh_{20}$), and the edge slicer at 315° ($E_{315}$). The diagram 400 also shows the Dl and Dh thresholds 405 and 410, respectively, disposed horizontally across the diagram 400 and establishing a low threshold and a high threshold for the data slicers, respectively. Thus, the dl threshold 405, corresponding to a value between approximately 150-175 mV, and the Dh threshold 410, corresponding to a value between approximately 650-700 mV, are at relatively equal levels for each of the data phases and at which levels the data slicers sample data. The diagram 400 also shows a $V_{cm}$ threshold 415 at between approximately 400-450 mV at which the edge slicers sample data.

The Dl threshold 405 and the Dh threshold 410 enable detection of data transitions that meet minimum threshold changes by the PD 324. For example, the receiver 204 may implement logic that captures CDR information based on identifying where data has transitions. For example, in the diagram 400 between times 0 and 40 nanoseconds (ns), when capturing CDR information, the PD 324 determines whether a transition exists or occurs in the data (whether there is a rising or falling edge in the data). The PD 324 will only identify low-to-high(0→1) minimum transitions, such as those data transitions that start below the Dl threshold 405 and end above the Dh threshold 410, and vice versa. Any transition that does not span the voltages between the Dh threshold 410 and the Dl threshold 405, either rising or falling, is ignored. Thus, in the window of times between 0-40 ns, the PD 324 identifies rising transitions for data that has a value of 0 as sampled by the $Dl_0$ slicer and a value of '1' as sampled by the $Dh_{90}$ slicer or falling transitions for data that has a value of '1' as sampled by the $Dh_0$ slicer and a value of '0' as sampled by the $Dl_{90}$ slicer. By ignoring the data transitions that do not meet these threshold requirements (starting above the Dh and ending below the Dl, or vice versa), the receiver 204 can avoid introducing jitter. Data signals that meet these threshold requirements mostly cross at a location where the edge slicers sample the data signals at the $V_{cm}$ threshold 415, which corresponds to an example location where an edge clock can lock. This transition logic can apply to any window between any successive data slicers. Such ISI filtering (filtering out those transitions that do not start above the Dh threshold 410 and end below the Dl threshold 405 or start below the Dl threshold 405 and end above the Dh threshold 410) reduces extraneous transition points that otherwise would create unhelpful CDR information. Unhelpful CDR information may comprise crossings that do not fall in a central region, for example, where the $E_{45}$ clock crosses the $V_{cm}$ and where the corresponding edge slicer samples the data signals. Such analysis can be repeated for each window of time between pairs of data slicers, which occur, for the example described herein, at 90° intervals. In some embodiments, all signals that meet the threshold requirements described above pass through a point at which the edge slicer $E_x$ samples the data signal between the pair of data slices in the window of time.

Figure 5:
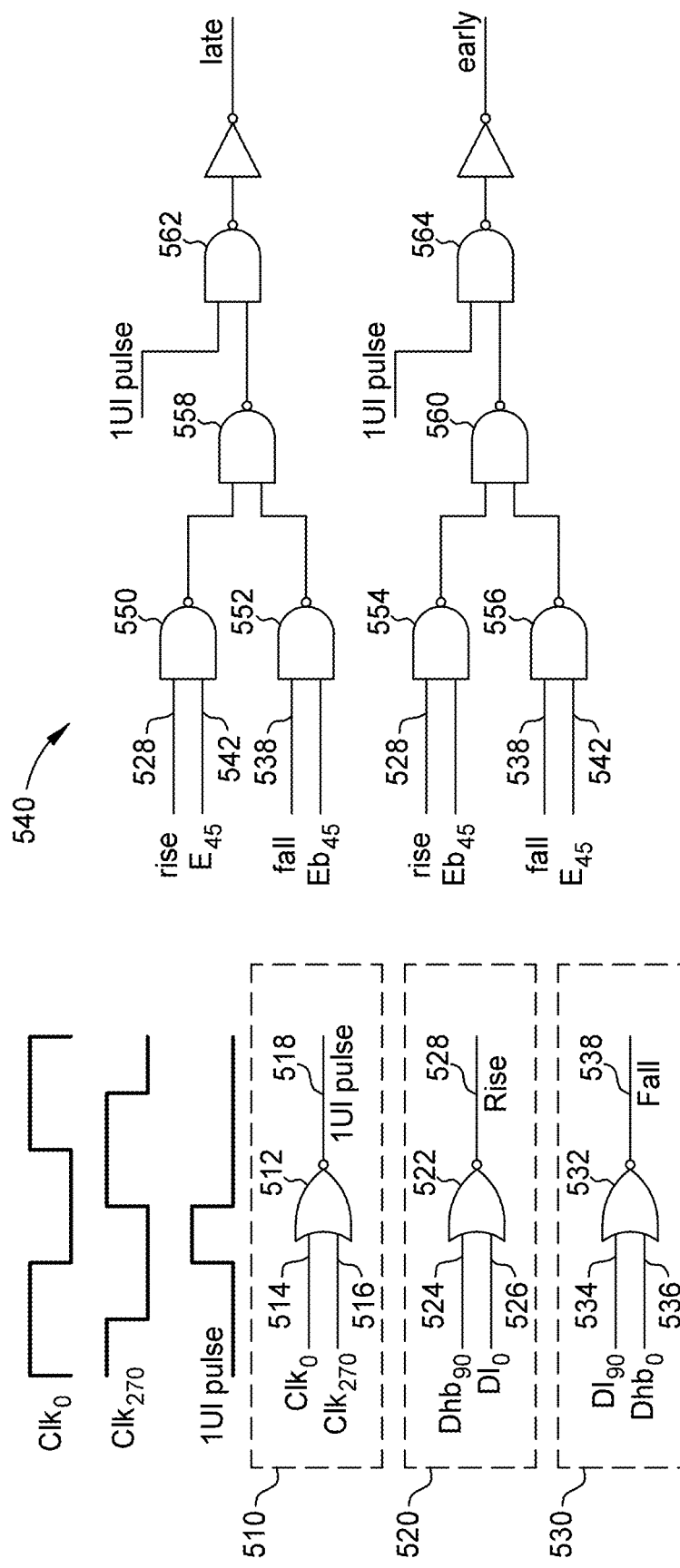
FIG. 5 show a block diagram of various stages of phase detector logic used to limit an output of a phase detector to 1 unit interval (UI).

FIG. 5 show a block diagram of various stages of phase detector logic used to limit an output of a phase detector to 1 unit interval (UI).

The block diagram includes a logic circuit 510 that creates a 1UI pulse signal based on a quarter-rate clock. The logic circuit 510 comprises a NOR gate 512 having a first input 514 of a clock signal Clk0 and second input 516 of a clock signal Clk270. The NOR gate 512, thus, generates an output signal 518 that is high or '1' when both the first input 514 and the second input 516 are low or '0'. The block diagram 500 further comprises logic circuits 520 and 530 that identify rising transitions and falling transitions (or neither). The logic circuit 520 comprises a NOR gate 522 having a first input 524 of a value sampled by the $Dh_{90}$ slicer and a second input 526 of a value sampled by the $Dl_0$ slicer. The NOR gate 522 generates an output 528 that is high or '1' when the first input 524 and the second input 526 are both low or '0'. The logic circuit 530 comprises a NOR gate 532 having a first input 534 of a value sampled by the $Dl_{90}$ slicer and a second input 536 of a value sampled by the $Dh_0$ slicer. The NOR gate 532 generates an output 538 that is high or '1' when the first input 534 and the second input 536 are both low or '0'.

This logic enables us to limit the up/down information from the PD 324 to 1UI. Based on the rising/falling edge detection of the logic circuits 520 and 530 in any window of time, we can determine when the data signal has a rising or falling transition. For example, for the logic circuit 520, when the value sampled by the $Dl_0$ slicer is '0' and the value sampled by the $Dh_{90}$ slicer rises from '0' to '1' causing the value of $Dhb_{90}$ to transition from '1' to '0', causing the rise signal to become '1', the logic circuit 520 will generate an output 528 that goes from low to high, indicating a rising edge. Similarly, when the logic circuit 530 has an input 534 of '0' for the $Dl_{90}$ slicer and an input 536 of '0' for the $Dhb_0$ signal (indicating that the $Dh_0$ was high), the logic circuit 530 indicates a falling edge.

The block diagram further includes logic circuit 540 that identifies the up/down information for the single UI. The logic circuit 540 monitors the rising and falling transitions as identified via the logic circuits 520 and 530 using NAND gates 550-560 and then incorporates the 1UI pulse using NAND gates 562 and 564 that are then inverted to limit the output of the up/down information to the single UI. For example, the NAND gate 550 can be used to determine whether the RX reference clock is leading or lagging the data. For example, if a rising edge at the output 528 is '1' and the corresponding edge slicer is '1' at $E_{45}$ signal 542, then the NAND gate 550 can determine that the RX reference clock may be leading the data. If the rising edge is '1' and the corresponding edge slicer is '0', then the dock may be lagging the data. Thus, the logic circuit 540 enables identification of early and late signals. This early and late information is combined with the 1UI pulse generated at output 518 to limit the early and late information to 1UI, which reduces in-band noise for the receiver. By ANDing the early and late signals with the 1UI pulse, the pulse width of the early and late signals to 1UI.

Figure 6:
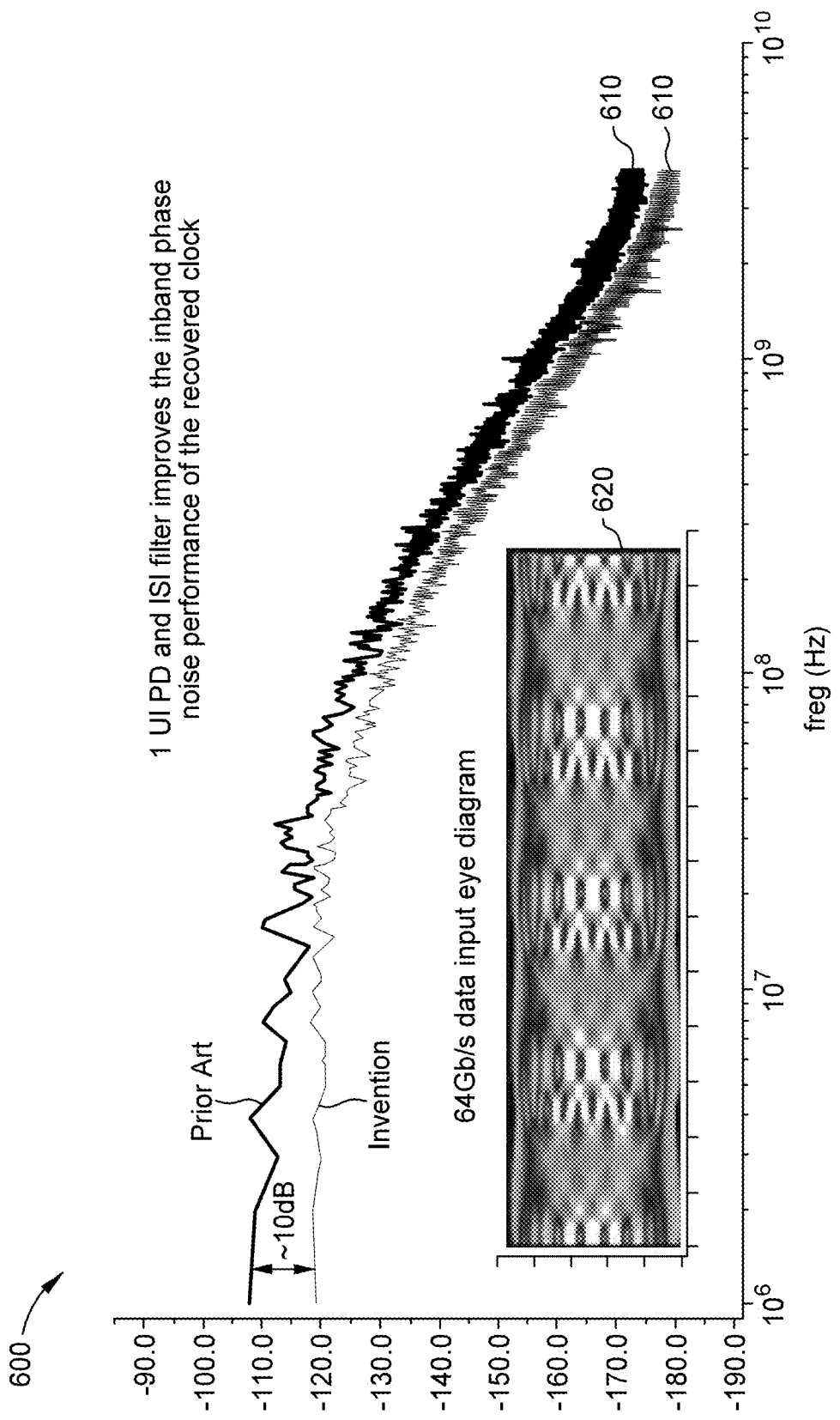
FIG. 6 shows a graph of simulation results of in-band phase noise improvements provided by the auxiliary CDR circuitry of FIG. 2.

FIG. 6 shows a graph 600 of simulation results of in-band phase noise improvements provided by the auxiliary CDR circuitry of FIG. 2 as compared to previous implementations without the 1 unit interval and ISI filter of the PD 324 for a data input eye diagram 620. The graph 600 shows phase noise measured in dB/Hz along the y-axis as a function of frequency measured in Hz along the x-axis. The graph 600 includes a trend line 605 representing an in-band noise generated for a clock signal recovered using the auxiliary CDR circuitry 118 based on, for example, a 64 Gb/s PAM-4 input as compared to a trend line 610 similar 64 Gb/s PAM-4 processed by an auxiliary CDR circuitry that lacks the ISI filter and the limitation to a single UI pulse. As shown, for nearly all frequencies from $10^6$ and between approximately 109 and 1010, implementing the ISI filter in the PD 324 and the 1UI limitation the improves in-band noise performed with respect to the recovered clock by approximately −10 dB.

Figure 7:
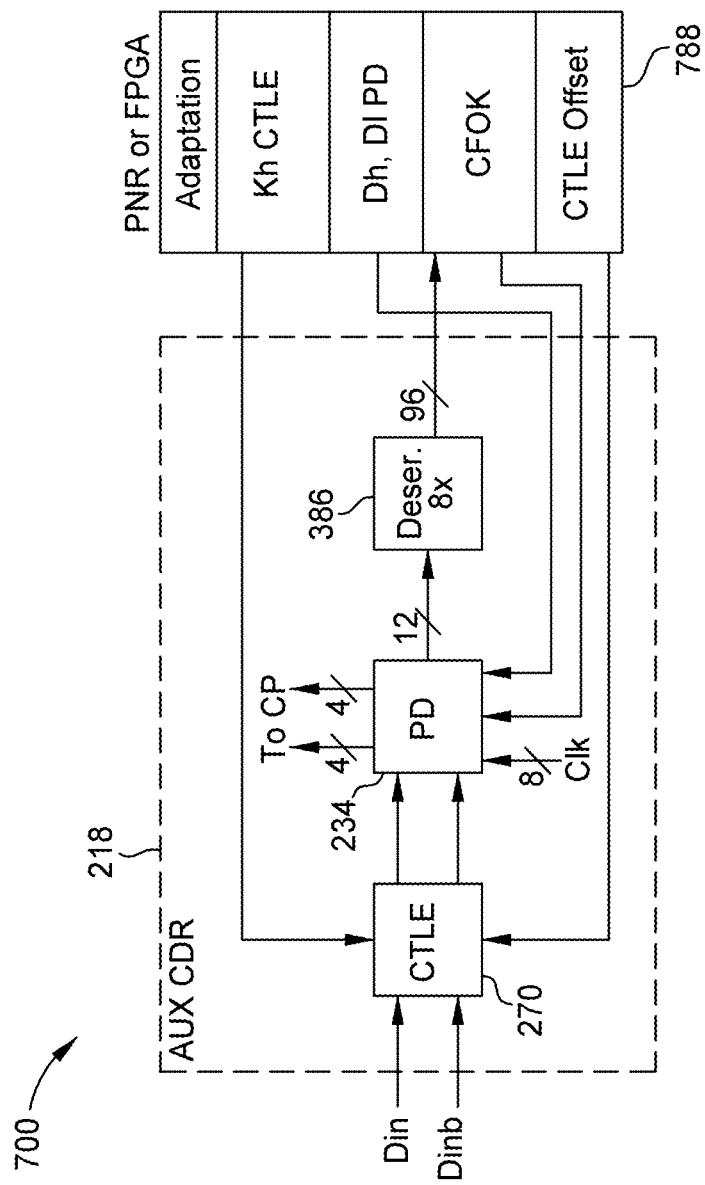
FIG. 7 depicts adaptation loops implemented in the auxiliary CDR circuitry of FIG. 2.

FIG. 7 depicts adaptation or calibration loops implemented in the auxiliary CDR circuitry described herein, such as the auxiliary CDR circuitry 118 of FIG. 1. As introduced above, the deserializer circuitry 386 can be used to slow down the speed of the outputs from the PD 324. The slowed data from the deserializer circuitry 386 may be passed to an off-chip or on-chip processing circuitry, such as a field programmable gate-array (FPGA) or place and route (PNR) logic block or calibration circuitry 788. The calibration circuitry 788 may perform one or more adaptation or calibration functions based on and using the information slowed down and provided by the deserializer circuitry 386.

In some embodiments, the calibration circuitry 788 may calibrate or cancel offset in one or more components of the receiver, such as one or more slicers in, for example, a PD such as the PD 324. The output of the second CTLE circuitry 270 may be set to a common mode and a Capture Flip-Flop Offset Cancellation (CFOK), comprising a calibration mode used to cancel slicer offsets, may be performed to cancel the offsets of the slicers in the PD. Then, an offset cancellation for the second CTLE circuitry 270 is performed. In some embodiments, such calibrations are performed individually or independently.

In some embodiments, the calibration circuitry 788 may run a real-time, slow adaptation or calibration for one or more of the high frequency peaking of the second CTLE circuitry 270 and the Dh and Dl thresholds of the data slicers of the PD. In some embodiments, the calibration circuitry 788 comprises a high frequency peaking calibration loop, which may operate more slowly than the Dh and Dl calibration loop (for example, 10 times more slowly than the Dh and Dl calibration loop), which runs more slowly than the auxiliary CDR circuitry 118. Such relationship ensure that the calibration circuitry 788 operates in conjunction with the corresponding receiver components and ensures or maintains system stability. Furthermore, because the calibration circuitry 788 can operate in real-time to adapt or calibrate the components of the receiver, the various components of the receiver are more resistant to real-time variations in environmental controls, such as temperature fluctuations and the like.

Thus, as shown in FIG. 7, based on the slowed down output of the deserializer circuitry, the calibration circuitry 788 may calibrate the second circuitry CTLE 270 using, for example, high frequency peaking calibration and the like, while the calibration circuitry 788 is able to calibrate the second CTLE circuitry 270 via, for example, CTLE offset calibration components. In some embodiments, one or more different calibrations can be applied to different components of the receiver in parallel with each other.

Figure 8A:
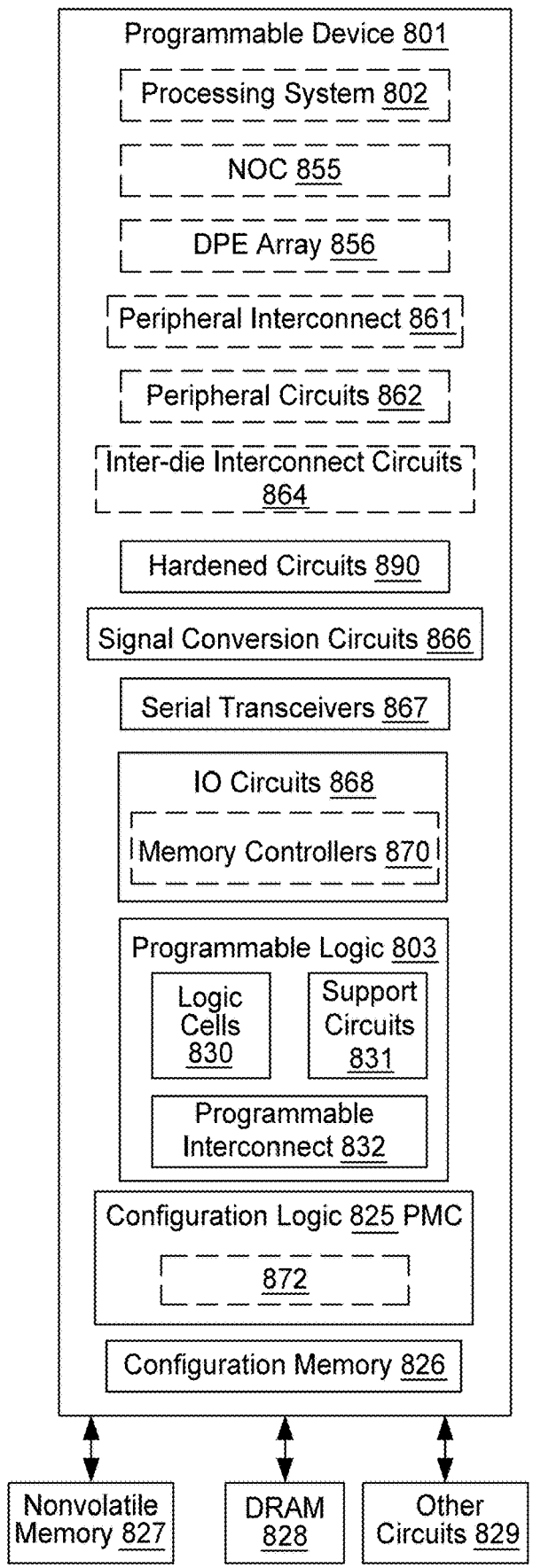
FIG. 8A is a block diagram depicting a programmable IC according to an example.

FIG. 8A is a block diagram depicting a programmable device 801 according to an example. The programmable device 801 includes programmable logic (PL) 803 (also referred to as a programmable fabric), input/output (IO) circuitries 868, serial transceivers 867, signal conversion circuitries 866, hardened circuitries 890, configuration logic 825, and configuration memory 826. The programmable device 801 can be coupled to external circuitries, such as nonvolatile memory 827, dynamic random access memory (DRAM) 828, and other circuitries 829. In various examples, the programmable device 801 further includes a processing system (PS) 802, a network-on-chip (NOC) 855, a data processing engine (DPE) array 856, peripheral interconnect 861, peripheral circuitries 862, and inter-die interconnect circuitries 864.

The PL 803 includes logic cells 830, support circuitries 831, and programmable interconnect 832. The logic cells 830 include circuitries that can be configured to implement general logic functions of a plurality of inputs. For example, the logic cells 830 may include the calibration circuitry 788 discussed above in FIGS. 1-7. The support circuitries 831 include dedicated circuitries, such as digital signal processors, memories, and the like. The logic cells and the support circuitries 831 can be interconnected using the programmable interconnect 832. Information for programming the logic cells 830, for setting parameters of the support circuitries 831, and for programming the programmable interconnect 832 is stored in the configuration memory 826 by the configuration logic 825. The configuration logic 825 can obtain the configuration data from the nonvolatile memory 827 or any other source (e.g., the DRAM 828 or from the other circuitries 829). In some examples, the configuration logic 825 includes a platform management controller (PMC) 872. The PMC 872 is configured to boot and configure the subsystems of the programmable device 801, such as the PL 803, the PS 802, the NoC 855, the DPE array 856, the signal conversion circuitries 866, the hardened circuitries 890, and the like.

The 10 circuitries 868 provide an external interface for the subsystems of the programmable device 801, such as the PL 803, the PS 802, and the like. In some examples, the 10 circuitries 868 include memory controllers 870 configured to interface external memories (e.g., the DRAM 828). Other connectivity circuitries can include the peripheral interconnect 861, the peripheral circuitries 862, and the inter-die interconnect circuitries 864. The peripheral interconnect 861 includes bus interface circuitries, such as peripheral component interconnect express (PCIe) circuitries and the like. The peripheral circuitries 862 include universal serial bus (USB) ports, Ethernet ports, universal asynchronous transceiver (UART) ports, serial peripheral interface (SPI) ports, general purpose IO (GPIO) ports, serial advanced technology attachment (SATA) ports, and the like. The inter-die interconnect circuitries 864 include circuitries configured to interface like inter-die interconnect circuitries in other programmable device(s) (e.g., for when the programmable device 801 is one die in a multi-die integrated circuit package). The serial transceivers 867 include high-speed transmit/receive circuitries configured to provide an external IO interface for the programmable device 801.

The PS 802 can include microprocessor(s), memory, support circuitries, IO circuitries, and the like. The NOC 855 is configured to provide for communication between subsystems of the programmable device 801, such as between the PS 802, the PL 803, the hardened circuitries 890, and the DPE array 856. The DPE array 856 can include an array of DPE's configured to perform data processing, such as an array of vector processors. The signal conversion circuitries 866 include analog-to-digital converters (ADCs) and digital-to-analog converters (DACs).

The hardened circuitries 890 comprise circuitries with predetermined functionality. A given hardened circuitry 890 can include one or more predetermined functions. Example hardened circuitries 890 include filters, mixers, sample-rate converters, transforms circuitries, and the like. A hardened circuitry 890 can be programmable to configure specific predetermined functionalities or select among predetermined functionalities. However, in contrast to a circuitry in the PL 803, a hardened circuitry 890 cannot be configured or reconfigured with different functionality. For example, a hardened circuitry 890 can include a filter having two predetermined and selectable functionalities. A third functionality cannot be added to the hardened circuitry 890, nor can one of the two functionalities be removed from the hardened circuitry 890. In contrast, a filter configured in the PL 803 can be reconfigured to add one more additional functionalities or to remove one or more functionalities. Further, a filter configured in the PL 803 can be removed entirely and replaced with another circuitry. In contrast, a hardened circuitry 890 cannot be removed from the programmable device 801 (but can be unused if desired).

FIG. 8B illustrates a field programmable gate array (FPGA) implementation of the PL 803 according to an example. The PL 803 shown in FIG. 8B can be used in any example of the programmable devices described herein. The PL 803 includes a large number of different programmable tiles including configurable logic blocks ("CLBs") 833, random access memory blocks ("BRAMs") 834, input/output blocks ("IOBs") 836, configuration and clocking logic ("CONFIG/CLOCKS") 842, digital signal processing blocks ("DSPs") 835, specialized input/output blocks ("I/O") 841 (e.g., configuration ports and clock ports), and other programmable logic 839 such as digital clock managers, analog-to-digital converters, system monitoring logic, and so forth.

In some PLs 803, each programmable tile can include at least one programmable interconnect element ("INT") 843 having connections to input and output terminals 848 of a programmable logic element within the same tile, as shown by examples included at the top of FIG. 8B. Each programmable interconnect element 843 can also include connections to interconnect segments 849 of adjacent programmable interconnect element(s) in the same tile or other tile(s). Each programmable interconnect element 843 can also include connections to interconnect segments 850 of general routing resources between logic blocks (not shown). The general routing resources can include routing channels between logic blocks (not shown) comprising tracks of interconnect segments (e.g., interconnect segments 850) and switch blocks (not shown) for connecting interconnect segments. The interconnect segments of the general routing resources (e.g., interconnect segments 850) can span one or more logic blocks. The programmable interconnect elements 843 taken together with the general routing resources implement a programmable interconnect structure ("programmable interconnect") for the illustrated PL.

In an example implementation, a CLB 833 can include a configurable logic element ("CLE") 844 that can be programmed to implement user logic plus a single programmable interconnect element ("INT") 843. A BRAM 834 can include a BRAM logic element ("BRL") 845 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 835 can include a DSP logic element ("DSPL") 846 in addition to an appropriate number of programmable interconnect elements. An IOB 836 can include, for example, two instances of an input/output logic element ("IOL") 847 in addition to one instance of the programmable interconnect element 843. As will be clear to those of skill in the art, the actual I/O pads connected, for example, to the I/O logic element 847 typically are not confined to the area of the input/output logic element 847.

In the pictured example, a horizontal area near the center of the die (shown in FIG. 8B) is used for configuration, clock, and other control logic. Vertical columns 851 extending from this horizontal area or column are used to distribute the clocks and configuration signals across the breadth of the PL.

Some PLs utilizing the architecture illustrated in FIG. 8B include additional logic blocks that disrupt the regular columnar structure making up a large part of the PL. The additional logic blocks can be programmable blocks and/or dedicated logic.

Note that FIG. 8B is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 8B are purely exemplary. For example, in an actual PL more than one adjacent row of CLBs is typically included wherever the CLBs appear, to facilitate the efficient implementation of user logic, but the number of adjacent CLB rows varies with the overall size of the PL.

Figure 8C:
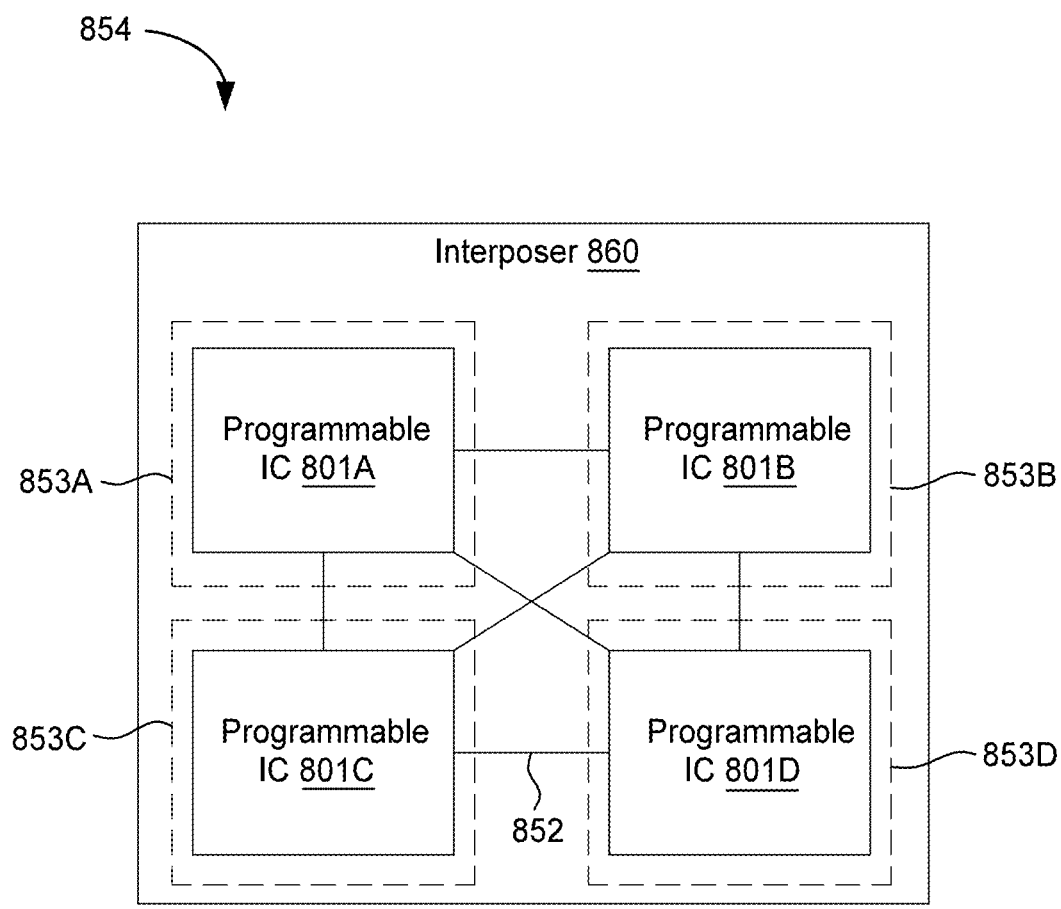
FIG. 8C is a block diagram depicting a multi-integrated circuit (IC) programmable device according to an example.

FIG. 8C is a block diagram depicting a multi-die programmable device 854 according to an example. The multi-die programmable device 854 includes a plurality of programmable devices 801, e.g., programmable devices 801A, 801B, 801C, and 801D. In an example, each programmable device 801 is an IC die disposed on an interposer 860. Each programmable device 801 comprises a super logic region (SLR) 853 of the programmable device 854, e.g., SLRs 853A, 853B, 853C, and 853D. The programmable devices 801 are interconnected through conductors on the interposer 860 (referred to as super long lines (SLLs) 52) and inter-die interconnect circuitries 864 disposed within each of the programmable devices 801. The programmable ICs could form one or more of the circuitries or components of the receiver or auxiliary CDR circuitry described above with reference to FIGS. 1-7. For example, the adaptation or calibration loops implemented in the auxiliary CDR circuitry described herein may be formed from programmable ICs described herein.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or apparatus, and the like. Accordingly, aspects may take the form of an entirely hardware embodiment or a combination of hardware products or an embodiment combining hardware aspects with corresponding programming that may all generally be referred to herein as a "circuitry" or "system." Furthermore, certain aspects, such as programmable logic blocks, lookup tables (LUTs), and the like, may take the form of hardware components that can be controlled using corresponding programming.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations or programming for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the users computer, partly on the users computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and apparatuses according to various examples of the present invention. In this regard, each block in the flowchart or block diagrams may represent a circuitry, programming for such circuitry, or portion of instructions for such circuitry, which comprises one or more executable instructions for controlling or programming the circuitry to perform the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit (IC), comprising:
   an auxiliary clock and data recovery (CDR) circuitry configured to oversample an incoming data signal and generate a locked clock signal,
   wherein:
      the auxiliary CDR circuitry comprises a phase-locked loop (PLL) configured to receive the incoming data signal and generate the locked clock signal, and
      the PLL comprises a phase detector (PD) configured to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

2. The IC of claim 1, wherein the PD is further configured to limit an output pulse generated by the PD to a single unit interval (UI).

3. The IC of claim 2, wherein the output pulse is limited to the single UI based on a single UI pulse generated based on a quarter-rate clock and combined with early and late information signals that control a charge pump.

4. The IC of claim 1, further comprising a calibration circuitry configured to calibrate one or more of the minimum data transition thresholds implemented by the ISI filter or offsets of slicers of the PD.

5. The IC of claim 4, wherein the auxiliary CDR circuitry further comprises:
   an equalizer configured to receive the incoming data signal and generate a first equalized signal;
   wherein the PLL is further configured to receive the first equalized signal and comprises:
      a phase-frequency detector (PFD)-based PLL configured to receive a reference clock signal relative to the incoming data signal and generate a corresponding clock signal; and
      a PD-based PLL configured to receive the incoming data signal, the first equalized signal, and the corresponding clock signal to generate the locked clock signal; and wherein when the PFD-based PLL is locked to the reference clock signal, the PFD-based PLL is disabled and the PD-based PLL is enabled in response to a set of control signals.

6. The IC of claim 5, wherein:
the auxiliary CDR further comprises a deserializer configured to deserialize an output from the PD, and
the calibration circuitry is further configured to one or more of:
loop calibrate the equalizer, or
calibrate an offset of the equalizer.

7. The integrated circuit of claim 5, wherein the PLL comprises:
a first divider configured to receive the reference clock signal;
a PFD coupled to an output of the first divider;
a first charge pump circuit coupled to an output of the PFD through a first switch;
a second charge pump circuit coupled to an output of the PFD through a second switch;
a loop filter coupled to both the first charge pump circuit and the second charge pump circuit; and
an oscillator coupled to the loop filter to provide the number of adjacent clock signals.

8. The integrated circuit of claim 7, wherein the loop filter comprises a digital loop filter and the oscillator comprises a digitally controlled oscillator.

9. The integrated circuit of claim 7, wherein the loop filter comprises an analog loop filter and the oscillator comprises a voltage controlled oscillator.

10. A method, comprising:
configuring an auxiliary clock and data recovery (CDR) circuitry to oversample an incoming data signal and generate a locked clock signal,
wherein:
configuring the auxiliary CDR circuitry comprises configuring a phase-locked loop (PLL) to receive the incoming data signal and generate the locked clock signal, and
configuring the PLL comprises configuring a phase detector (PD) to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

11. The method of claim 10, further comprising further configuring the PD to limit an output pulse generated by the PD to a single unit interval (UI).

12. The method of claim 11, wherein the output pulse is limited to the single UI based on a single UI pulse generated based on a quarter-rate clock and combined with early and late information signals that control a charge pump.

13. The method of claim 10, further comprising configuring a calibration circuitry to calibrate one or more of the minimum data transition thresholds implemented by the ISI filter or offsets of slicers of the PD.

14. The method of claim 13, wherein configuring the auxiliary CDR circuitry further comprises configuring an equalizer configured to receive the incoming data signal and generate a first equalized signal and configuring the PLL to receive the first equalized signal;

wherein configuring the PLL further comprises:
configuring a phase-frequency detector (PFD)-based PLL to receive a reference clock signal relative to the incoming data signal and generate a corresponding clock signal; and
configuring a PD-based PLL to receive the incoming data signal, the first equalized signal, and the corresponding clock signal to generate the locked clock signal; and
wherein when the PFD-based PLL is locked to the reference clock signal, the PFD-based PLL is disabled and the PD-based PLL is enabled in response to a set of control signals.

15. The method of claim 14, further comprising further configuring the calibration circuitry to one or more of:
loop calibrate the equalizer, or
calibrate an offset of the equalizer,
wherein configuring the auxiliary CDR further comprises configuring a deserializer to deserialize an output from the PD.

16. The method of claim 14, wherein configuring the PLL further comprises:
configuring a first divider to receive the reference clock signal;
coupling a PFD to an output of the first divider;
coupling a first charge pump circuit to an output of the PFD through a first switch;
coupling a second charge pump circuit to an output of the PFD through a second switch;
coupling a loop filter to both the first charge pump circuit and the second charge pump circuit; and
coupling an oscillator to the loop filter to provide the number of adjacent clock signals.

17. The method of claim 16, wherein the loop filter is a digital loop filter and the oscillator is a digitally controlled oscillator.

18. The method of claim 16, wherein the loop filter is an analog loop filter and the oscillator is a voltage controlled oscillator.

19. An integrated circuit (IC) configured to receive an incoming data signal in response to a reference clock signal, the IC comprising:
a clock generation circuit configured to receive the reference clock signal and generate a first clock signal; and
a phase-locked loop (PLL) configured to receive the incoming data signal and generate a second clock signal; a selection circuit configured to receive the first clock signal and the second clock signal and output a selected clock signal in response to a corresponding selection signal,
wherein the PLL comprises a phase detector (PD) configured to receive the incoming data signal and capture a number of samples of the incoming data signal in response to a number of adjacent clock signals and minimum data transition thresholds implemented by an intersymbol interference (ISI) filter, the minimum data transition thresholds identifying minimum data transitions in the incoming data signal.

20. The IC of claim 19, wherein the PD is further configured to limit an output pulse generated by the PD to a single unit interval (UI).

* * * * *

UNITED STATES PATENT AND TRADEMARK OFFICE
CERTIFICATE OF CORRECTION

PATENT NO. : 11,469,877 B1
APPLICATION NO. : 17/400762
DATED : October 11, 2022
INVENTOR(S) : Mayank Raj and Parag Upadhyaya It is certified that error appears in the above-identified patent and that said Letters Patent is hereby corrected as shown below:

In the Specification

Column 2, Line 14 (approx.), Delete "dock" and insert -- clock --, therefor.

Column 2, Line 27, Delete "amore" and insert -- a more --, therefor.

Column 4, Line 61, Delete "dock" and insert -- clock --, therefor.

Column 5, Line 7, Delete "dock" and insert -- clock --, therefor.

Column 10, Line 16, Delete "$D_{in}$" and insert -- $D_{inb}$ --, therefor.

Column 12, Line 55, Delete "$(D_{120})$," and insert -- $(Dl_{20})$, --, therefor.

Column 14, Line 26, Delete "dock" and insert -- clock --, therefor.

Column 14, Line 48, Delete "109" and insert -- $10^9$ --, therefor.

Column 14, Line 48, Delete "1010," and insert -- $10^{10}$, --, therefor.

Signed and Sealed this
Seventh Day of March, 2023

Katherine Kelly Vidal
*Director of the United States Patent and Trademark Office*